United States Patent [19]
Ikeda et al.

[11] Patent Number: 5,724,394
[45] Date of Patent: Mar. 3, 1998

[54] VITERBI DECODING METHOD AND DECODER CAPABLE OF ELIMINATING PHASE INDETERMINACY

[75] Inventors: Tamotsu Ikeda, Tokyo; Yasunari Ikeda, Kanagawa; Takahiro Okada, Chiba, all of Japan

[73] Assignee: Sony Corporation, Tokyo, Japan

[21] Appl. No.: 503,942

[22] Filed: Jul. 19, 1995

[30] Foreign Application Priority Data

Jul. 26, 1994 [JP] Japan ................... 6-173810

[51] Int. Cl.$^6$ .................................. H04L 87/06
[52] U.S. Cl. ................... 375/341; 375/262; 329/345
[58] Field of Search .......................... 375/341, 339, 375/262, 261, 265, 225, 226; 371/43; 329/345

[56] References Cited

U.S. PATENT DOCUMENTS

| | | | |
|---|---|---|---|
| 4,578,800 | 3/1986 | Yasuda et al. | 375/341 |
| 5,095,392 | 3/1992 | Shimazaki et al. | 329/345 |
| 5,113,411 | 5/1992 | Yoshida et al. | 375/341 |
| 5,119,243 | 6/1992 | Shimazaki et al. | 329/345 |
| 5,457,705 | 10/1995 | Todoroki | 371/43 |

*Primary Examiner*—Wellington Chin
*Assistant Examiner*—Congvan Tran
*Attorney, Agent, or Firm*—Limbach & Limbach L.L.P.

[57] ABSTRACT

In a Viterbi decoder and a Viterbi decoding method, a modulating method and a phase of a carrier wave, employed in a transmitter apparatus can be automatically followed up in a receiver apparatus. The Viterbi decoder is comprised of a phase shifting circuit for shifting a phase of a reproduced carrier wave of a reception signal in response to a phase-shift control signal, thereby producing a phase-shifted signal; a distance calculating circuit for receiving the phase-shifted signal to calculate a square Euclidean distance between a signal point of the phase-shifted signal and a signal point defined in a predetermined modulating method; path metric calculator for calculating a path metric with respect to each of the phases from the calculated square Euclidean distance value; a selector means for selecting a minimum value of the path metric for each of the phases; and a phase-shift control signal producing circuit for producing the phase-shift control signal used to control the phase shifting means in such a manner that the phase of the reproduced carrier wave of the reception signal is set to a phase corresponding to the minimum path metric value.

15 Claims, 4 Drawing Sheets

VITERBI DECODER 39

VITERBI DECODING METHOD AND DECODER CAPABLE OF ELIMINATING PHASE INDETERMINACY

BACKGROUND OF THE INVENTION

1. Field of the Invention

The present invention relates to a Viterbi decoder and a Viterbi decoding method capable of automatically following a transmission modulating system when a signal which has been modulated in a trellis coding manner is received and also eliminating phase indeterminacy of a reproduced carrier wave.

2. Description of the Related Art

Generally speaking, in communication paths with severe power restrictions, coding gains are obtained by employing error correction codes to lower power. In such a communication system, in general, a convolution encoding operation is carried out on the transmission side, whereas a Viterbi decoding operation is performed on the reception side. In particular, such a trellis coding/modulating system into which the modulation method and the coding method have been merged is recently introduced.

This trellis decoding/modulating system corresponds to such a system that input data is convolution-coded, and also this convolution code is allocated to a modulation signal point in such a manner that a Euclidean distance becomes maximum. On the reception side, the decoding operation is carried out by utilizing the Viterbi algorithm.

As a concrete trellis modulating system, there are the coded 8PSK system, the coded 16 QAM system, the coded 32 QAM system, the coded 64 QAM system and so on.

In FIG. 3 and FIG. 4, there are represented an example of a transmitter apparatus and also a receiver apparatus employed in the coded 16 QAM system, respectively.

In the transmitter apparatus 10 of FIG. 3, inputted data is encoded (coded) by a convolution encoding circuit 1 to be outputted as parallel convolution code to a signal allocating circuit 2. This parallel convolution code is allocated to a preselected signal point by the signal allocating circuit 2, so that an I signal and a Q signal, corresponding to the signal point, are produced. These I signal and Q signal are supplied to a 16 QAM modulating circuit 9. This signal allocation is described in "Channel Coding with Multilevel/Phase Signals" by Gottfried Ungerboeck, IEEE TRANSACTIONS ON INFORMATION THEORY, Vol. IT 28, No. 1, January 1982, pages 55 to 67.

In a modulating circuit 9, either the Q signal, or the I signal is multiplied by either a carrier wave derived from a local oscillating circuit 5, or a carrier wave delayed by 90 degrees by a hybrid circuit 6 in either a mixer (multiplier circuit) 4 or 3, respectively. Thereafter after the multiplied output is added by an adder circuit 7 and preselected frequency band component is extracted from the added multiplier output by a band pass filter (BPF) 8, thereby to be outputted as a modulated signal to a signal transmission path.

In the receiver apparatus 20 of FIG. 4, the signal received via the signal transmission path is inputted into a 16 QAM demodulator 30. This reception signal (modulated signal) is subdivided into two signal paths in the 16 QAM demodulator 30, and then the subdivided reception signals are entered into mixers (multiplier circuits) 31 and 32. Also, in the mixers 32 and 31, both of a reproduced carrier wave derived from an internal circuit employed in a carrier reproducing circuit 33, and a carrier wave delayed by 90 degrees by the hybrid (HB) circuit 34 are supplied, respectively. Since these signals are multiplied by the reception signal (modulated signal in these mixers 32 and 31), this reception signal is demodulated as a baseband signal. After this demodulated signal is further filtered by low-pass filters (LPF) 35 and 36, the filtered signal is digitalized by A/D converters 37 and 38 into a digital filtered signal which is then supplied to a Viterbi decoder 39. In the Viterbi decoder 39, errors occurring in the signal transmission path are corrected to decode the original data.

FIG. 5 represents an example of an arrangement of the Viterbi decoder 39. The I signal and the Q signal, which have been digitalized by the A/D converters 37 and 38, respectively, are entered into a square Euclidean distance calculating circuit 51, whereby the square Euclidean distances between these I, Q signals and the respective signal points of the assumed modulation method are calculated. The square Euclidean distances are inputted as a so called "branch metric" into an ACS (Add, Compare, Select) circuit (calculation signal) 52 so as to calculate a maximum likelihood path. A path memory 53 stores therein a preselected stage of decoding paths under control of the ACS circuit 52, and finally outputs the content of the maximum likelihood path obtained by the ACS circuit 52. A parallel-to-serial (P/S) converter 54 converts the parallel data obtained from the path memory 53 into the corresponding serial data which will then be outputted.

To obtain the correct data in this receiver apparatus 20, it is required that the modulating method assumed in the receiver apparatus 20 must be completely made coincident with the modulating method of the transmitter apparatus 10. If the modulating method of the transmitter apparatus 10 is fixed, then there is no problem because this fixed modulating method is assumed in the receiver apparatus 20 to receive the data. However, when the transmitter apparatus 10 employs various types of modulating methods, the receiver apparatus 20 must follow the modulating method employed in the transmitter apparatus 10. However, when the modulating method is changed on the transmitter side, the conventional receiver apparatus 20 can not follow this changed modulating method. As a consequence, there is to problem that the conventional receiver apparatus 20 can not correctly read the data.

Furthermore, even if the modulating method assumed in the receiver apparatus 20 is coincident with the modulating method of the transmitter apparatus 10, both of the frequency of the reproduced carrier wave and the phase thereof used in the receiver apparatus 20 must be coincident with those of the carrier wave used in the transmitter apparatus 10 in order to obtain the correct data. Even when any type of carrier wave reproducing circuit is employed, the frequencies can be reproduced. However, indeterminacy still remains when the phase is reproduced. In the case of the 16 QAM system, there are four phase conditions of 0, 90, 180, and 270 degrees as the indeterminacy conditions. Conventionally, to solve this phase indeterminacy, a so-termed "differential code" is utilized. However, there are other problems that since the conventional system must employ a specific circuit to perform the phase coding/decoding operation, the complex arrangement should be required and a high cost would be required.

SUMMARY OF THE INVENTION

The present invention has been made to solve the above-described problems, and therefore, has an object to provide a Viterbi decoder/decoding method with a small circuit scale, capable of receiving a signal, while following a modulating method of a transmitter end, and also capable of eliminating phase indeterminacy in a reproduced carrier wave.

A Viterbi decoder, according to the present invention, is featured by comprising:

phase shifting means (e.g., phase shift circuit 61 of FIG. 1) for shifting a phase of a reproduced carrier wave of a reception signal in response to a phase-shift control signal, thereby producing a phase-shifted signal;

distance calculating (e.g., square Euclidean distance calculating circuit 51 of FIG. 1) means for receiving said phase-shifted signal to calculate a square Euclidean distance between a signal point of said phase-shifted signal and a signal point defined in a predetermined modulating method;

path metric calculating means (e.g., ACS circuit 52 of FIG. 1) for calculating a path metric with respect to each of said phases from said calculated square Euclidean distance value;

path metric accumulating means for accumulating said path metrics obtained from said path metric calculating means during a predetermined time;

selecting means (e.g., selecting circuit 72 of FIG. 1) for selecting a minimum value of said accumulated path metrics for each of said phases; and phase-shift control signal producing means (e.g., control circuit 63 of FIG. 1) for producing said phase-shift control signal used to control said phase shifting means in such a manner that the phase of the reproduced carrier wave of said reception signal is set to a phase corresponding to said minimum path metric value.

A Viterbi decoding method, according to the present invention, is featured by comprising:

a first step for shifting a phase of a reproduced carrier wave of a reception signal in response to a phase-shift control signal, thereby producing a phase-shifted signal;

a second step for receiving said phase-shifted signal to calculate a square Euclidean distance between a signal point of said phase-shifted signal and a signal point defined in a predetermined modulating method;

a third step for calculating a path metric with respect to each of said phases from said calculated square Euclidean distance value;

a fourth step for accumulating said path metrics obtained at said third step during a predetermined time;

a fifth step for selecting a minimum value of said accumulated path metrics for each of said phases; and a sixth step for producing said phase-shift control signal used to control the phase shift of said reproduced carrier wave at said first step in such a manner that the phase of the reproduced carrier wave of said reception signal is set to a phase corresponding to said minimum path metric value.

Further, a receiver apparatus, according to the present invention, is featured by comprising:

means for receiving a signal transmitted via a signal transmission path;

means for subdividing said reception signal into two signal series of a first signal and a second signal;

first multiplying means for multiplying said first signal by a reproduced carrier wave;

second multiplying means for multiplying said second signal by a carrier wave produced by delaying said reproduced carrier wave by 90 degrees;

phase shifting means for shifting a phase of the reproduced carrier wave in response to a phase-shift control signal, thereby producing a phase-shifted signal;

distance calculating means for receiving said phase-shifted signal to calculate a square Euclidean distance between a signal point of said phase-shifted signal and a signal point defined in a predetermined modulating method;

path metric calculating means for calculating a path metric with respect to each of said phases from said calculated square Euclidean distance value;

selecting means for selecting a minimum value of said path metric for each of said phases; and phase-shift control signal producing means for producing said phase-shift control signal used to control said phase shifting means in such a manner that the phase of the reproduced carrier wave of said reception signal is set to a phase corresponding to said minimum path metric value.

The above-described reference value may have different values from each other, depending upon the respective modulating methods.

Also, the selecting means, and the phase shift control signal producing means may be realized by employing a microcomputer.

As previously described, since the phase of the reproduced carrier wave of the reception signal is set to the phase corresponding to the minimum path metric value, even when any of the phases of the carrier wave is set in the transmitter end, this set phase can be detected and the data can be surely read. The arrangements of the Viterbi decoder and also for executing the Viterbi decoding method can be made simple, resulting in low cost.

In accordance with the Viterbi decoder and the Viterbi decoding method in one embodiment of the present invention, the minimum path metric value defined in a preselected modulating method is compared with a predetermined reference value. When the minimum path metric value is larger than the reference value, since the modulating method is changed, even if any type of modulating methods is employed in the transmitter end, the receiver end can automatically follow up this modulating method, so that the data can be correctly read out.

BRIEF DESCRIPTION OF THE DRAWINGS

For a better understanding of the present invention, reference is made of the detailed description to be read in conjunction with the accompanying drawings, in which.

DETAILED DESCRIPTION OF THE PREFERRED EMBODIMENTS

Figure 1:
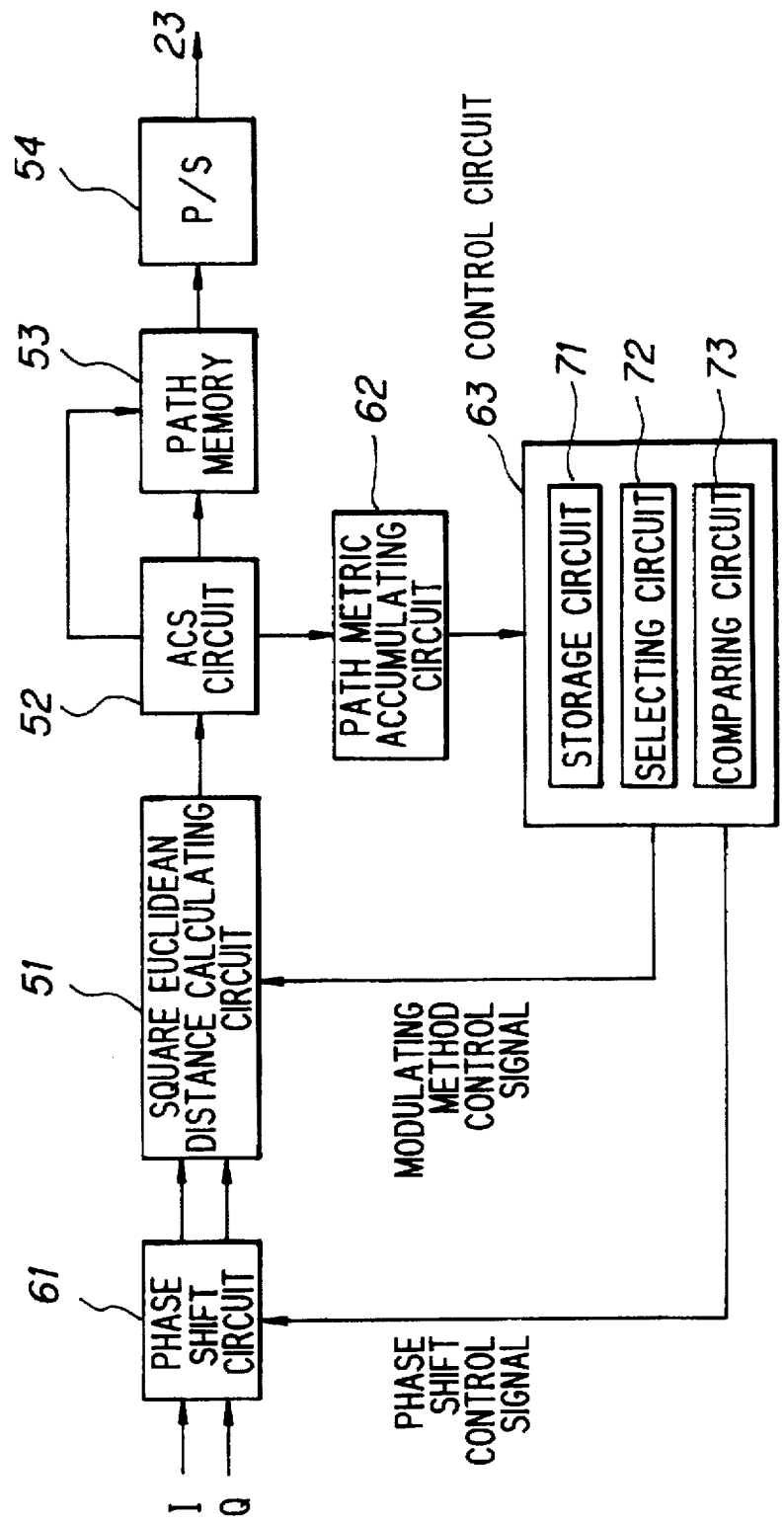
FIG. 1 is a schematic block diagram for indicating an example of an arrangement of a Viterbi decoder according to an embodiment of the present invention.
Figure 4:
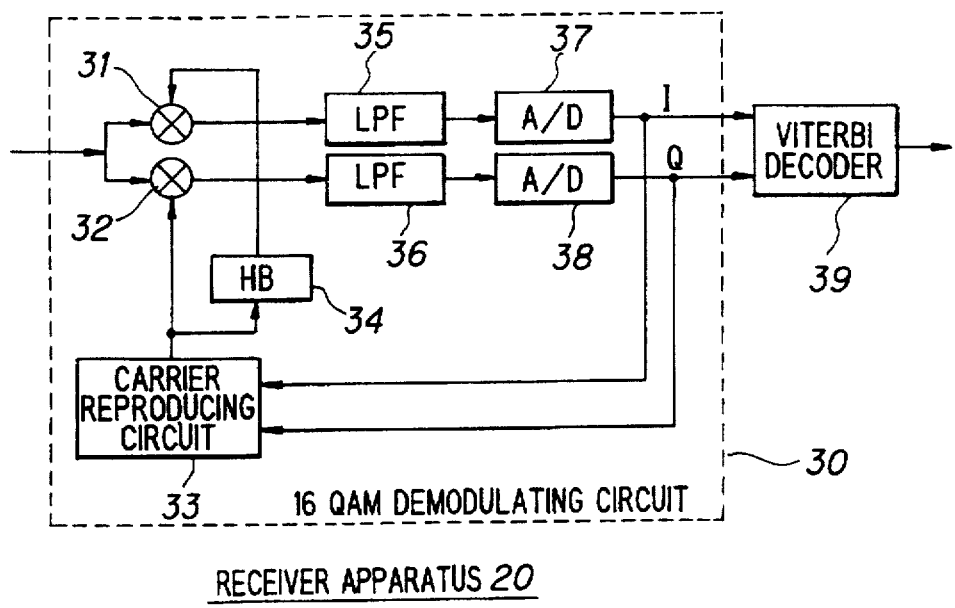
FIG. 4 is a schematic block diagram for showing an example of the structure of the conventional receiver apparatus.
Figure 5:
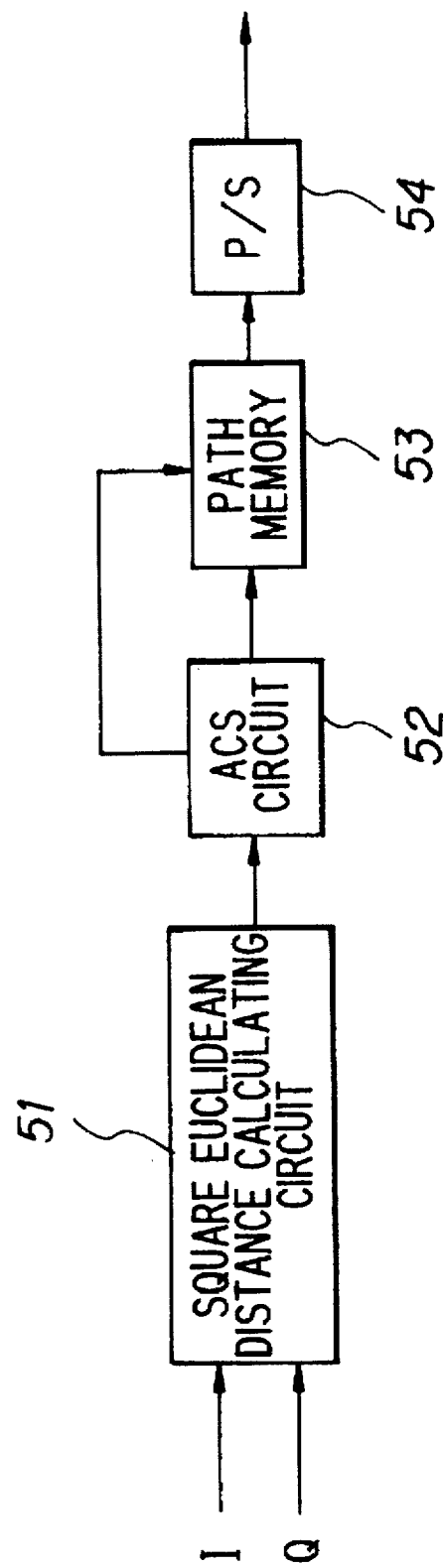
FIG. 5 is a schematic block diagram for showing the arrangement of the conventional Viterbi decoder indicated in FIG. 4.

FIG. 1 schematically shows an arrangement of a Viterbi decoder according to an embodiment of the present invention. It should be noted that the same reference numerals indicated in FIG. 5 are employed as those for denoting the same or similar circuit blocks shown in FIG. 1. In this embodiment, the I signal and the Q signal, which are outputted from the QAM demodulating circuit 30 of the receiver apparatus 20 indicated in FIG. 4, are entered into a phase shift circuit 61. In this phase shift circuit 61, the phases of these I and Q signals are shifted to have predetermined phases in response to a phase shift control signal supplied from a control circuit 63. Thereafter, the phase shifted I and Q signals are supplied to a square Euclidean distance calculating circuit 51. An output from an ACS circuit 52 is supplied to a path metric accumulating circuit 62, so that the path metric is accumulated with this output data. Further, an output data derived from the path metric accumulating circuit 62 is supplied to a control circuit 63 arranged by, for instance, a microcomputer.

The control circuit 63 includes a storage circuit 71 for storing the data supplied from the path metric accumulating circuit 62, a selecting circuit 72 for selecting a phase corresponding to an accumulated value of the minimum path metrics, and a comparing circuit 73 for comparing a minimum path metric value with a preset reference value. The control circuit 63 generates the phase control signal and a modulating method control signal by way of these circuits, which are outputted to the phase shift circuit 61 and the square Euclidean distance circuit 51. It should be noted that other circuit arrangements are similar to those of the Viterbi decoder shown in FIG. 4.

In operation, first the control circuit 63 makes assumptions of a preselected modulating method and also a phase of a reproduced carrier wave, and transfers the modulating method control signal and the phase shift control signal to the square Euclidean distance calculating circuit 51 and the phase shift circuit 61, respectively.

In the phase shift circuit 61, the phases of the reproduced carrier waves (namely, I signal and Q signal) are controlled in response to the phase control signal, so that the I signal and the Q signal, which have predetermined phases, are supplied to the square Euclidean distance calculating circuit 51. In response to the modulating method control signal, the square Euclidean distance calculating circuit 51 calculates square Euclidean distances between the signals entered from the phase shift circuit 61 and the respective signal points of the assumed modulating method. The square Euclidean distances between this reception signal and the respective signal points are inputted as branch metrics to the ACS circuit 52.

In the ACS circuit 52, a maximum likelihood path is calculated to be recognized as a path metric. At this time, the path metric becomes a minimum value of a state metric under the assumed modulating method (corresponding to the modulating method control signal and the phase shift control signal) and the phase condition.

This path metric is accumulated by only a constant value (for example, 250×12 pieces) in the path metric accumulating circuit 62, and the accumulated result is sent to the control circuit 63.

The control circuit 63 is equipped with the storage circuit 71 for storing therein the accumulated values of the path metrics corresponding to the respective phase conditions, and the selecting circuit 72 for selecting a minimum accumulated value of the path metrics obtained with respect to all of the phase conditions. Then, the control circuit 63 outputs such a signal for setting a phase state corresponding to the minimum accumulated value to the phase shift circuit 61 as the phase shift control signal.

Also, the control circuit 63 includes the comparing circuit 73 for comparing the minimum path metric with a preselected reference value which is specifically given to the presently assumed modulating method. When the minimum path metric is smaller than this preselected reference value, the control circuit 63 holds the presently outputted modulating method control signal, while recognizing that the present assumption related to the modulating method is correct. To the contrary, when the minimum path metric is greater than this preselected reference value, the control circuit 63 judges that the presently assumed modulating method is different from the modulating method employed at the transmitter end, and thus transfers the modulating method control signal to a subsequent condition so as to sequentially investigate the phase conditions again.

By sequentially repeating such an operation, the receiver apparatus 20 can follow up the modulating method of the transmitter apparatus, and further can eliminate the phase indeterminacy of the reproduced carrier wave.

Figure 2:
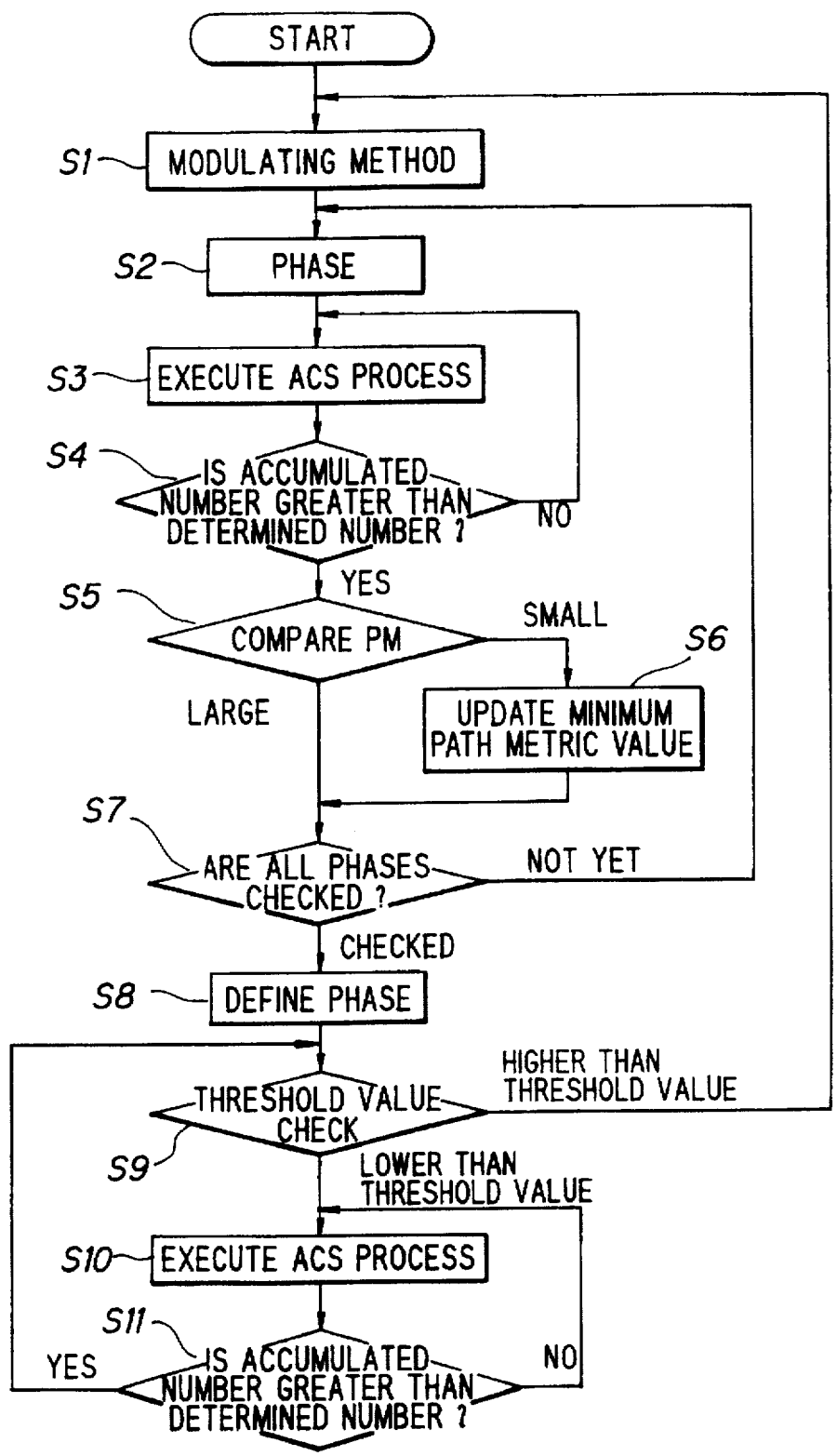
FIG. 2 is a flow chart for explaining operations of the Viterbi decoder shows in FIG. 1.
Figure 3:
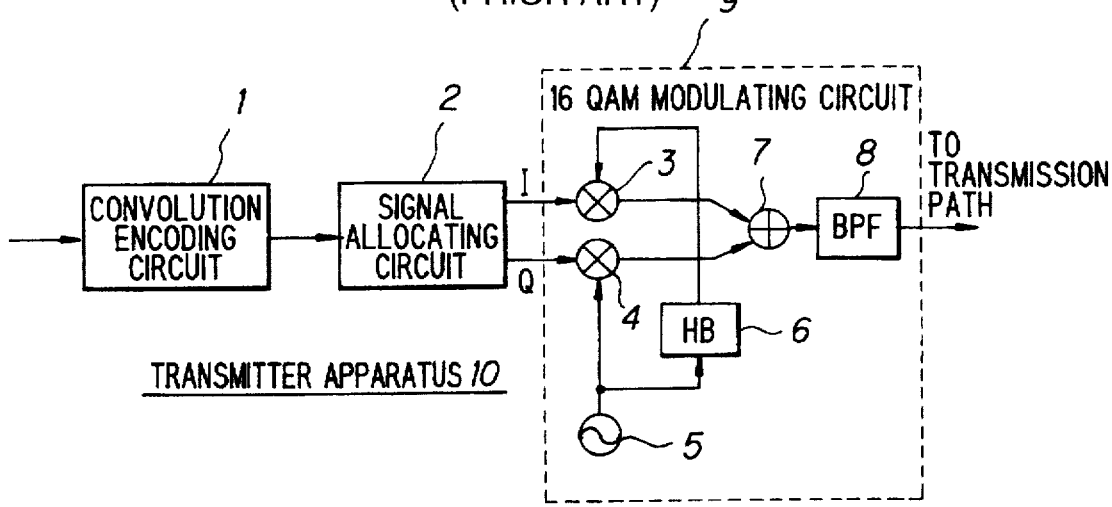
FIG. 3 is a schematic block diagram for representing an example of the structure of the conventional transmitter apparatus.

FIG. 2 is a flow chart for representing the above-described control method of the control circuit 63.

At a step S1, first, an assumption is made of a predetermined modulating method among the modulating methods under consideration, and then the modulating method control signal thereof is outputted as an initial value. For instance, the 16 QAM system is set which is selected from the 16 QAM system, the 32 QAM system, and the 64 QAM system. Next, at a step S2, a predetermined phase condition is first assumed as another initial value from the phase conditions under consideration, and then a phase shift control signal thereof is outputted. For example, 0 degree is set among 0, 90, 180, and 270 degrees.

At a step S3, square Euclidean distances between signal points assumed based on the modulating method set at the step S1 and the phase condition set at the step S2, and also a signal point of the reception signal are calculated by the square Euclidean distance calculating circuit 51. Furthermore, the path metrics are calculated by the ACS circuit 52, and the calculated path metrics are accumulated by the path metric accumulating circuit 62.

At a step S4, a judgment is made as to whether or not the number of this path metric accumulation reaches a preselected number (e.g., 250×12 times). If this accumulation number does not reach a preselected number, then the process operation is returned to the previous step S3. At this step S3, square Euclidean distances further are calculated by the square Euclidean distance calculating circuit 51 as to a signal point of the next reception signal. Furthermore, a path metric is calculated by the ACS circuit 52, and then this calculated path metric is furthermore accumulated by the path metric accumulating circuit 62. When the number of path metric accumulation reaches a preselected number, the process operation is advanced to the next step S5.

At the step S5 and another step S6, both of a minimum value of the accumulated path metrics and a phase condition corresponding thereto are updated. In other words, when the accumulated value is smaller than the previously stored minimum value of the accumulated path metrics, the process operation is advanced to a step S6. At this step S6, this path metric accumulated value is stored as a new minimum accumulated path metric, and a phase condition corresponding thereto is stored as the present phase condition. On the other hand, when the accumulated value is larger than the previously stored minimum value of the accumulated path metrics, no update operation is carried out for the minimum accumulated path metric and the phase condition corresponding thereto, and then the process operation is advanced to the subsequent step S7.

At a step S7, another judgment is made as to whether or not the comparing operations of the accumulated path metrics related to all of the phase conditions have been accomplished. When the comparing operations of the accumulated path metrics related to all of the phase conditions has not yet been completed, the accumulated value of the path metrics is reset and then the process operation is returned to the step S2 at which the comparing operation is advanced to the next phase condition (for instance, 90 degrees), so that a similar process operation is carried out. When the comparing operations of the accumulated path metrics related to all of the phase conditions (0, 90, 180, and 270 degrees) have been accomplished, the process operation is advanced to the subsequent step S8.

At this step S8, it is so judged that the phase condition corresponding to the minimum accumulated path metric stored at the step S6 is correct, and this phase condition is assured.

Further, at a step S9, a check is done as to whether or not the modulating method presently assumed by the receiver apparatus 20 is coincident with the modulating method of the transmitter apparatus 10 (namely, whether or not synchronization is maintained). In other words, the minimum accumulated path metric value stored at the step S6 is compared with a predetermined reference value (threshold value) preset to the respective modulating methods. When the minimum accumulated path metric value is smaller than the reference value, it is so judged that the modulating method assumed by the receiver apparatus 20 is coincident with the modulating method of the transmitter apparatus 10, so that the present modulating method is held, and then the process operation is advanced to a step S10 and a further step S11.

At the step S10 and the step S11, a similar process operation to that of the steps S3 and S4 is executed. That is, a square Euclidean distance between the assumed signal point and the reception signal point, and further a path metric are calculated. Then, when the number of accumulating operation reaches a predetermined value, the process operation is returned to the step S9 at which the subsequent process operation is repeated. The repetition of the process operations defined at the step S9 to S11 implies that the system is brought into the monitoring state. In other words, as to both of the modulating method and the phase, it is monitored that both of the transmitter side and the receiver side are under a synchronization condition.

On the other hand, when it is so judged at the step S9 that the minimum accumulated path metric value is larger than the reference value, such a judgment is established that the modulating method assumed by the receiver apparatus 20 is not coincident with the modulating method of the transmitter apparatus 10. Then, the accumulated value of the path metric is reset and the process operation is returned to the step S1 at which a new modulating method is set and a similar process operation to the above-explained process operation is repeatedly performed.

When, for instance, the 64 QAM system is assumed in the receiver apparatus 20, since the phase indeterminacy conditions of the reproduced carrier wave are four, the phase is sequentially shifted to investigate the accumulated path metric minimum values of these four conditions. As a result, first the correct phase condition is predicted.

Subsequently, the correct modulating method is predicted. If the modulating method of the transmitter apparatus 10 corresponds to the 64 QAM system, the calculated minimum value of the accumulated path metrics is smaller than the reference value corresponding to the 64 QAM and the synchronization condition can be established. On the other hand, when the minimum accumulated path metric value is larger than the reference value, it is so judged that the modulating method employed in the transmitter end is not equal to the presently assumed modulating method. Then, the process operation is returned to the step S1 at which such a next modulating method as the 32 QAM system is newly assumed in the receiver apparatus 20, and the subsequent process operations are carried out.

Since the above-described process operations are repeatedly performed, the modulating method of the transmitter apparatus 10 can be made coincident with the modulating method of the receiver apparatus 20. Also, the phase of the reproduced carrier wave can be synchronized with the phase of the transmitter end.

It should be understood that when the control circuit 73 is constructed of a microcomputer, a complex logic judgment may be simply realized by way of a software, and further a hardware scale may be reduced.

As previously described, according to the Viterbi decoder recited in claim 1 and the Viterbi decoding method recited in claim 5, since the phase of the reproduced carrier wave of the reception signal is set to the phase corresponding to the minimum path metric value, even when any of the phases of the carrier wave is set in the transmitter end, this set phase can be detected and the data can be surely read. The arrangements of the Viterbi decoder and also for executing the Viterbi decoding method can be made simple, resulting in low cost.

In accordance with the Viterbi decoder recited in claim 2 and the Viterbi decoding method recited in claim 6, the minimum path metric value defined in a preselected modulating method is compared with a predetermined reference value. When the minimum path metric value is larger than the reference value, since the modulating method is changed, even if any type of modulating methods is employed in the transmitter end, the receiver end can automatically follow up this modulating method, so that the data can be correctly read out.

What is claimed is:

1. A Viterbi decoder comprising:

phase shifting means for shifting a phase of a reproduced carrier wave of a reception signal in response to a phase-shift control signal, thereby producing a phase-shifted signal;

distance calculating means for receiving said phase-shifted signal to calculate a square Euclidean distance between a signal point of said phase-shifted signal and a signal point defined in a predetermined modulating method selected from among a plurality of predetermined modulating methods;

path metric calculating means for calculating a path metric with respect to each of said phases from said calculated square Euclidean distance value;

path metric accumulating means for accumulating said path metrics obtained from said path metric calculating means during a predetermined time;

selecting means for selecting a minimum value of said accumulated path metrics for each of said phases; and phase-shift control signal producing means for producing said phase-shift control signal used to control said phase shifting means in such a manner that the phase of the reproduced carrier wave of said reception signal is set to a phase corresponding to said minimum path metric value.

2. A Viterbi decoder as claimed in claim 1, further comprising:

changing means for comparing said minimum path metric value for each of said phases in said selected predetermined modulating method with a preset reference value to change said modulating method in accordance with a comparison result to another one of said plurality, of predetermined modulating methods.

3. A Viterbi decoder as claimed in claim 2 wherein:

said changing means changes said predetermined modulating method when said minimum path metric value is larger than said reference value.

4. A Viterbi decoder as claimed in claim 2 wherein:

said changing means produces a modulating method control signal for instructing the change of said predetermined modulating method to said distance calculating means in response to said comparison result, and supplies said produced modulating method control signal to said distance calculating means; and said distance calculating means changes said predetermined modulating method in response to said modulating method control signal, and calculates a square Euclidean distance between a signal point defined by said changed predetermined modulating method and said signal point of said modulating method control signal.

5. A Viterbi decoder as claimed in claim 1 wherein:

said reference value corresponds to values different from each other for each of said plurality of predetermined modulating methods.

6. A Viterbi decoding method comprising:

a first step for shifting a phase of a reproduced carrier wave of a reception signal in response to a phase-shift control signal, thereby producing a phase-shifted signal;

a second step for receiving said phase-shifted signal to calculate a square Euclidean distance between a signal point of said phase-shifted signal and a signal point defined in a predetermined modulating method selected from among a plurality of predetermined modulating methods;

a third step for calculating a path metric with respect to each of said phases from said calculated square Euclidean distance value;

a fourth step for accumulating said path metrics obtained at said third step during a predetermined time;

a fifth step for selecting a minimum value of said accumulated path metrics for each of said phases; and a sixth step for producing said phase-shift control signal used to control the phase shift of said reproduced carrier wave at said first step in such a manner that the phase of the reproduced carrier wave of said reception signal is set to a phase corresponding to said minimum path metric value.

7. A Viterbi decoding method as claimed in claim 6, further comprising:

a seventh step for comparing said minimum path metric value for each of said phases in said predetermined modulating method with a preset reference value to change said predetermined modulating method in accordance with a comparison result.

8. A Viterbi decoding method as claimed in claim 7 wherein:

at said seventh step, when said minimum path metric value is larger than said reference value, said predetermined modulating method is changed.

9. A Viterbi decoding method as claimed in claim 7 wherein:

at said seventh step, a modulating method control signal for instructing the change of said predetermined modulating method is produced in response to said comparison result; and at said second step, said predetermined modulating method is changed in response to said modulating method control signal, and a square Euclidean distance between a signal point defined by said changed predetermined modulating method and said signal point of said modulating method control signal is calculated.

10. A receiver apparatus comprising:

means for receiving a signal transmitted via a signal transmission path;

means for subdividing said reception signal into two signal series of a first signal and a second signal;

first multiplying means for multiplying said first signal by a reproduced carrier wave;

second multiplying means for multiplying said second signal by a carrier wave produced by delaying said reproduced carrier wave by 90 degrees;

phase shifting means for shifting a phase of the reproduced carrier wave in response to a phase-shift control signal, thereby producing a phase-shifted signal;

distance calculating means for receiving said phase shifted signal and calculating a square Euclidean distance value between a signal point of said phase-shifted signal and a signal point defined in a predetermined modulating method;

path metric calculating means for calculating a path metric with respect to each of said phases from said calculated square Euclidean distance value;

selecting means for selecting a minimum value of said path metric for each of said phases; and phase-shift control signal producing means for producing said phase-shift control signal used to control said phase shifting means in such a manner that the phase of the reproduced carrier wave of said reception signal is set to a phase corresponding to said minimum path metric value.

11. A receiver apparatus as claimed in claim 10, further comprising:

changing means for comparing said minimum path metric value for each of said phases in said predetermined modulating method with a preset reference value to change said modulating method in accordance with a comparison result.

12. A receiver apparatus as claimed in claim 11 wherein:

said changing means changes said modulating method when said minimum path metric value is larger than said reference value.

13. A receiver apparatus as claimed in claim 11 wherein:

said changing means produces a modulating method control signal for instructing the change of said modulating method to said distance calculating means in response to said comparison result, and supplies said produced modulating method control signal to said distance calculating means; and said distance calculating means changes said modulating method in response to said modulating method control signal, and calculates a square Euclidean distance between a signal point defined by said changed modulating method and a signal point of said modulating method control signal.

14. A receiver apparatus as claimed in claim 10, further comprising:

path metric accumulating means for accumulating said path metrics obtained from said path metric calculating means during a predetermined time, wherein:

said selecting means selects a minimum value of said accumulated path metrics for each of said phases.

15. A receiver apparatus as claimed in claim 11 wherein:

said reference value corresponds to values different from each other for each of said modulating methods.

* * * * *

UNITED STATES PATENT AND TRADEMARK OFFICE
CERTIFICATE OF CORRECTION

PATENT NO.: 5,724,394
DATED: March 3, 1998
INVENTOR(S): TAMOTSU IKEDA ET AL.

It is certified that error appears in the above-identified patent and that said Letters Patent is hereby corrected as shown below:

At Col. 9, line 15, please replace "claim 1" with "claim 2".

Signed and Sealed this

First Day of September, 1998

Attest:

BRUCE LEHMAN

Attesting Officer

Commissioner of Patents and Trademarks